United States Patent
Sforzin et al.

(10) Patent No.: US 11,804,271 B2
(45) Date of Patent: *Oct. 31, 2023

(54) OPERATIONAL MODES FOR REDUCED POWER CONSUMPTION IN A MEMORY SYSTEM

(71) Applicant: Micron Technology, Inc., Boise, ID (US)

(72) Inventors: Marco Sforzin, Cernusco Sul Naviglio (IT); Umberto Di Vincenzo, Capriate San Gervasio (IT); Daniele Balluchi, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/726,351

(22) Filed: Apr. 21, 2022

(65) Prior Publication Data

US 2022/0246220 A1 Aug. 4, 2022

Related U.S. Application Data

(63) Continuation of application No. 17/124,084, filed on Dec. 16, 2020, now Pat. No. 11,335,416.

(51) Int. Cl.
*G11C 11/00* (2006.01)
*G11C 16/30* (2006.01)
*G11C 16/04* (2006.01)

(52) U.S. Cl.
CPC .......... *G11C 16/30* (2013.01); *G11C 16/0483* (2013.01)

(58) Field of Classification Search
CPC ..... G11C 16/30; G11C 16/0483; G11C 5/147; G11C 11/1697; G11C 11/2297; G11C 13/0038; G11C 2207/2227; G11C 5/145; G11C 5/148

USPC ........................................................ 365/147
See application file for complete search history.

(56) References Cited

U.S. PATENT DOCUMENTS

| | | |
|---|---|---|
| 5,455,794 A | 10/1995 | Javanifard et al. |
| 5,563,825 A | 10/1996 | Cernea et al. |
| 5,677,874 A | 10/1997 | Kaname |
| 7,154,803 B2 | 12/2006 | Martinelli et al. |

(Continued)

FOREIGN PATENT DOCUMENTS

CN 110400585 A 11/2019

OTHER PUBLICATIONS

Chinese Patent Office, "Office Action and Search Report", issued in connection with Chinese Patent Application No. 202111545010.X dated Nov. 2, 2022 (10 pages).

*Primary Examiner* — Tha-O H Bui
(74) *Attorney, Agent, or Firm* — Holland & Hart LLP

(57) ABSTRACT

Methods, systems, and devices for operational modes for reduced power consumption in a memory system are described. A memory device may be coupled with a capacitor of a power management integrated circuit (PMIC). The memory device may operate in a first mode where a supply voltage is provided to the memory device from the PMIC. The memory device may operate in a second mode where it is isolated from the PMIC. When isolated, a node of the memory device (e.g., an internal node) may be discharged while the capacitor of the PMIC remains charged. When the memory device resumes operating in the first mode, a supply voltage may be provided to it based on the residual charge of the capacitor.

20 Claims, 6 Drawing Sheets

(56) References Cited

U.S. PATENT DOCUMENTS

| | | | |
|---|---|---|---|
| 7,881,142 B2 * | 2/2011 | Arakawa | G11C 5/145 |
| | | | 365/189.11 |
| 10,720,838 B1 * | 7/2020 | Harshey | H02M 1/0061 |
| 2019/0081548 A1 * | 3/2019 | McRae | H02M 3/07 |
| 2019/0333563 A1 | 10/2019 | Di Vincenzo | |
| 2020/0211623 A1 | 7/2020 | Raad et al. | |

* cited by examiner

OPERATIONAL MODES FOR REDUCED POWER CONSUMPTION IN A MEMORY SYSTEM

CROSS REFERENCE

The present application for patent is a continuation of U.S. patent application Ser. No. 17/124,084 by Sforzin et al., entitled "OPERATIONAL MODES FOR REDUCED POWER CONSUMPTION IN A MEMORY SYSTEM," filed Dec. 16, 2020, assigned to the assignee hereof, and is expressly incorporated by reference in its entirety herein.

FIELD OF TECHNOLOGY

The following relates generally to one or more systems for memory and more specifically to operational modes for reduced power consumption in a memory system.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
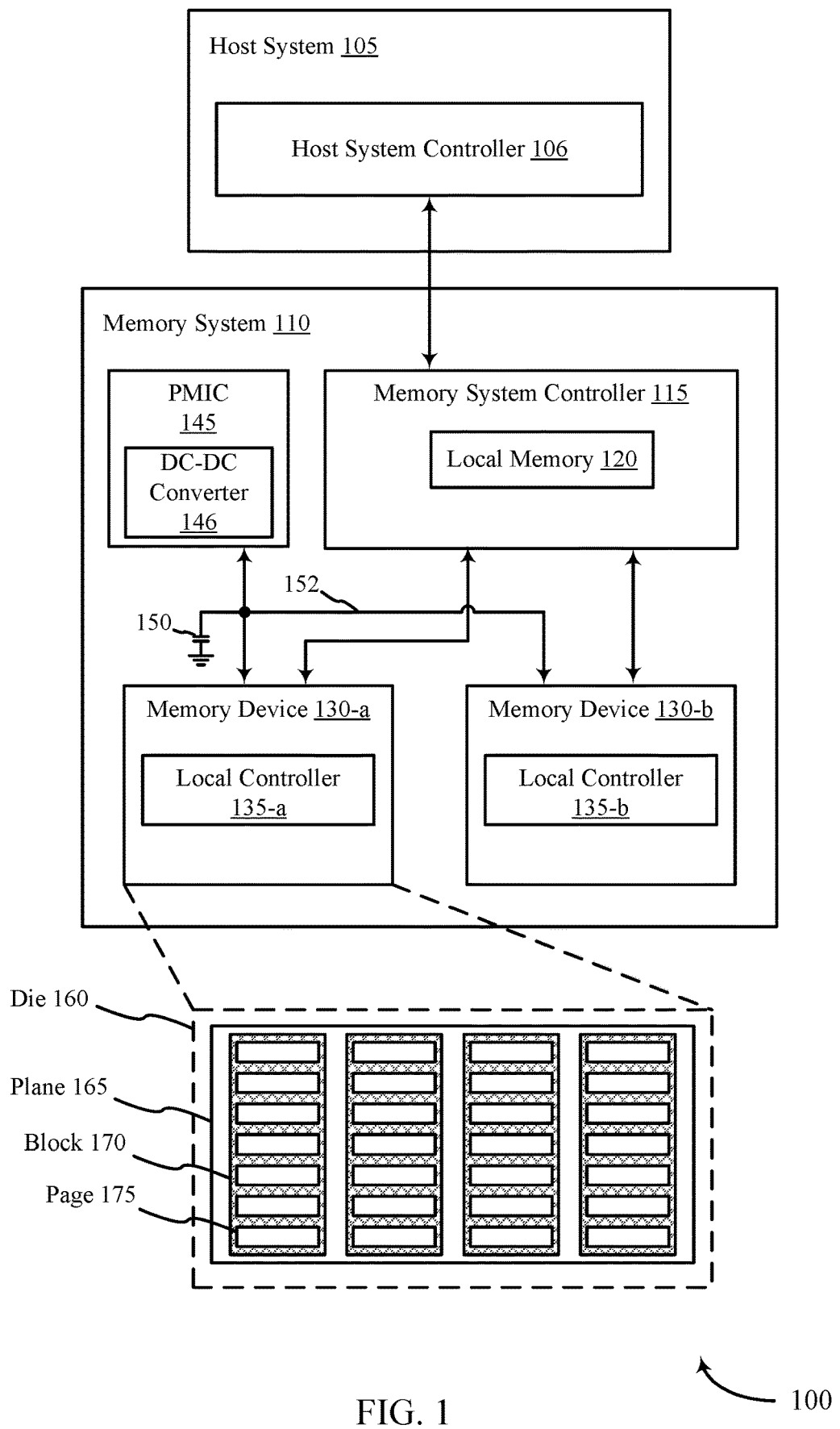
FIG. 1 illustrates an example of a system that supports operational modes for reduced power consumption in a memory system in accordance with examples as disclosed herein.

Memory systems may include non-volatile memory (NVM), and a power management integrated circuit (PMIC) which produces one or more high (e.g., positive or negative) voltages used by NVMs. The PMIC may use charge pumps or boost converters to generate the voltages used by the NVMs, and the system may include capacitors (e.g., high-capacity capacitors that may also be referred to as decoupling, bypass, or tank capacitors) to store supply voltages and for buffering. The memory devices may have operating modes where they use the high (e.g., positive or negative) supply voltages stored to the capacitors, and a standby mode where internal supply nodes are grounded to reduce internal stress and leakage current. However, reducing or grounding the internal supply nodes may also discharge a corresponding tank capacitor, and substantial power may be used for re-charging the tank capacitor after the memory device exits standby mode. Accordingly, management of charging of the capacitor and the internal supply nodes for reduced power consumption may be desirable.

A system configured to discharge one or more internal supply nodes while the corresponding tank capacitor remains charged is described herein. The memory system described herein may include a PMIC coupled with one or more memory devices (e.g., one or more NVM devices). The memory system may include a capacitor (e.g., a tank capacitor) associated with each supply voltage that is configured to store a charge that may be used for providing the supply voltage to the memory devices (e.g., to provide current during current spikes drawn from the supply voltage by the memory devices). The capacitor may be charged using a respective Direct Current to Direct Current (DC-DC) converter (e.g., charge pump or boost converter). Each memory device may include a first pass gate that is coupled with an internal node of the memory device and a node coupled with a capacitor of the PMIC. Additionally or alternatively, each memory device may include a second pass gate that is coupled with the internal node and a voltage source (e.g., an internal voltage source, an external voltage source, or a ground node).

When a memory device operates in a first mode (e.g., an active mode), the charge stored at the respective tank capacitor may be used to provide a supply voltage to the memory device. While operating in the first mode, the first pass gate may be activated to couple the internal node with the node coupled with the capacitor of the PMIC and the second pass gate may be deactivated. The memory device operating in the first mode may discharge (e.g., draw current from) the capacitor. The capacitor may be charged (e.g., re-charged) using the DC-DC converter. A voltage of the internal node of the memory device may be approximately equal to the supply voltage provided by the PMIC.

In some instances, the memory device may transition to operating in a second mode (e.g., a low power mode, a standby mode). While operating in the second mode, the first pass gate may be deactivated to isolate the internal node from the node coupled with the capacitor of the PMIC. Moreover, the second pass gate may be activated to couple the internal node with the voltage source (e.g., the ground voltage source). The internal node may be discharged (e.g., pulled to a ground voltage) based on activating the second pass gate. By discharging the internal node while the memory device (e.g., the internal node of the memory device) is isolated from the PMIC, the capacitor of the PMIC may remain charged. The stored charge may be used to provide a supply voltage to the memory device when it reenters the first mode (e.g., the active mode). Accordingly, the capacitor may not have to be fully recharged, which may result in a substantial power savings for the memory system.

Features of the disclosure are initially described in the context of systems as described with reference to FIGS. 1 and 2. Features of the disclosure are described in the context of memory systems as described with reference to FIGS. 3 and 4. These and other features of the disclosure are further illustrated by and described with reference to an apparatus diagram and flowcharts that relate to operational modes for reduced power consumption in a memory system as described with reference to FIGS. 5 and 6.

FIG. 1 is an example of a system 100 that supports operational modes for reduced power consumption in a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, the host system 105 may be coupled with any quantity or types of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

Memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, where memory system 110 includes more than one memory device 130, different memory devices 130 within memory system 110 may include the same or different types of memory cells.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130, and other such operations, which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. And in some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (Fe-RAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM). Additionally or alternatively, a memory device 130 may include one or more arrays of volatile memory cells. For example, a memory device 130 may include random access memory (RAM) memory cells, such as dynamic RAM (DRAM) memory cells and synchronous DRAM (SDRAM) memory cells.

In some examples, a memory device 130 may include (e.g., on a same die or within a same package) a local controller 135, respectively, which may execute operations on one or more memory cells of the memory device 130. A local controller 135 may operate in conjunction with a memory system controller 115 or may perform one or more functions ascribed herein to the memory system controller 115.

In some cases, a memory device 130 may be or include a NAND device (e.g., NAND flash device). A memory device 130 may include a memory die 160 and a controller 135. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support operational modes for reduced power consumption in a memory system. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, when executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some examples, the memory system 110 may include or may be coupled with a PMIC 145 that is configured to power one or more memory devices 130. The PMIC may include or provide charge to one or more capacitors 150 (e.g., a tank capacitor) that are configured to store charge that may be used for providing a supply voltage to the memory devices 130. The capacitors 150 may be charged using a respective DC-DC converter 146. Each memory device 130 may include a first pass gate that is coupled with an internal node of the memory device 130 and a voltage supply node 152 coupled with the capacitor 150. Additionally or alternatively, each memory device 130 may include a second pass gate that is coupled with the internal node and a voltage source (e.g., a ground voltage source).

Each memory device 130 may be configured to operate in a first mode (e.g., an active mode) and a second mode (e.g., a low power mode, a standby mode). For example, when the memory device 130-a operates in a first mode, the charge stored at the respective capacitor 150 may be used to provide a supply voltage (e.g., provide current at the supply voltage) to the memory device 130-a. While operating in the first mode, the first pass gate may be activated to couple the internal node of the memory device 130-a with the node 152 coupled with the capacitor 150 and the second pass gate may be deactivated. As the capacitor 150 is discharged, it may be charged (e.g., re-charged) using the DC-DC converter 146. A voltage of the internal node of the memory device 130-a may be approximately equal to the supply voltage provided by the PMIC and capacitor 150.

In some instances, the memory device 130-a may transition to operating in a second mode (e.g., a low power mode, a standby mode). While operating in the second mode, the first pass gate may be deactivated to isolate the internal node of the memory device 130-a from the node 152 coupled with the capacitor 150. Moreover, the second pass gate may be activated to couple the internal node of the memory device 130-a with the voltage source (e.g., the ground voltage source). The internal node of the memory device 130-a may be discharged (e.g., pulled to a ground voltage) based on activating the second pass gate or maintained at a voltage level that may allow for the memory device 130-a to exit a standby mode relatively quickly. By discharging the internal node while the memory device 130-a (e.g., the internal node of the memory device 130-a) is isolated from the node 152, the capacitor 150 may remain charged. The stored charge may be used to provide a supply voltage to the memory device 130-a when it reenters the first mode (e.g., the active mode). Accordingly, the capacitor 150 may not have to be fully recharged, which may result in a substantial power savings for the memory system 110.

Figure 2:
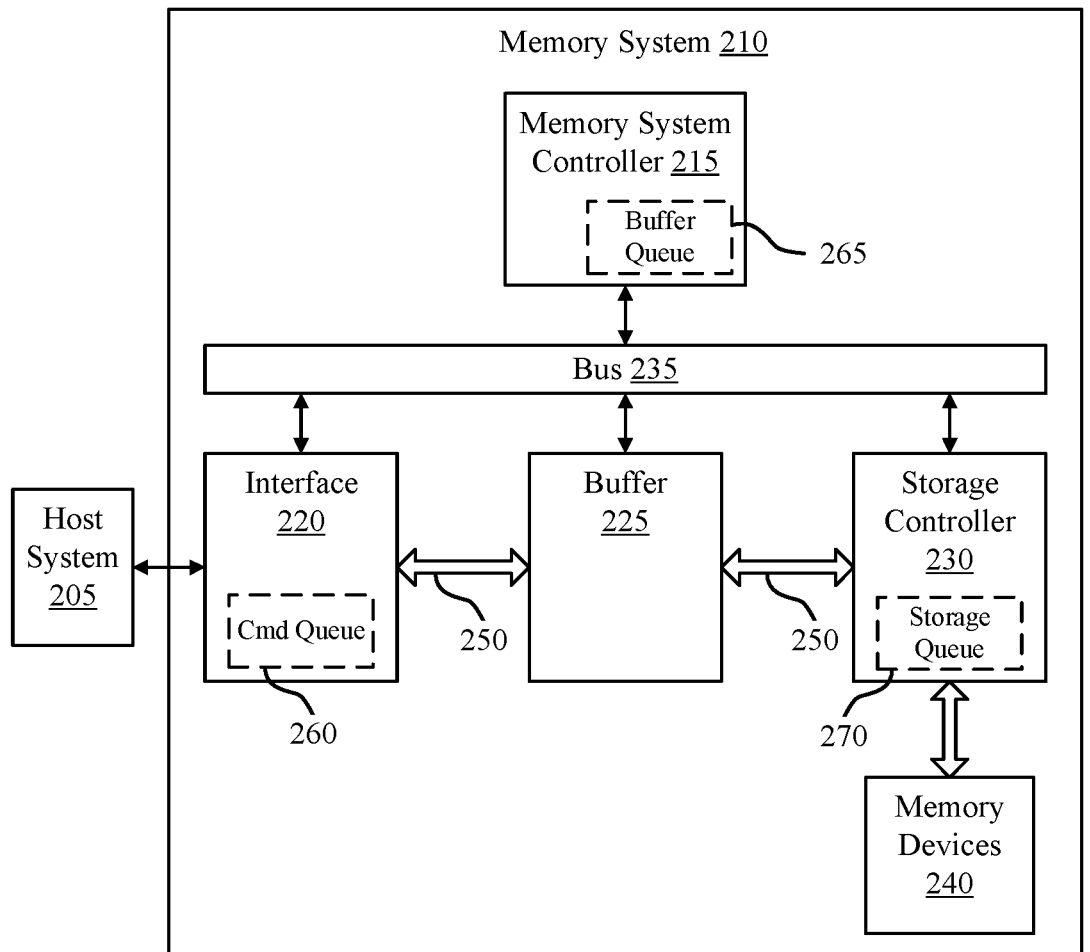
FIG. 2 illustrates an example of a system that supports operational modes for reduced power consumption in a memory system in accordance with examples as disclosed herein.

FIG. 2 illustrates an example of a system 200 that supports operational modes for reduced power consumption in a memory system in accordance with examples as disclosed herein. The system 200 may be an example of a system 100 as described with reference to FIG. 1 or aspects thereof. The system 200 may include a memory system 210 configured to store data received from the host system 205 and to send data to the host system 205, when requested by the host system 205 using access commands (e.g., read commands or write commands). The system 200 may implement aspects of system 100 as described with reference to FIG. 1. For example, the memory system 210 and the host system 205 may be examples of the memory system 110 and the host system 105, respectively.

Memory system 210 may include memory devices 240 to store data transferred between memory system 210 and the host system 205, e.g., in response to receiving access commands from the host system 205, as described below. The memory devices 240 may include one or more memory devices as described with reference to FIG. 1. For example, the memory devices 240 may include NAND memory, PCM, self-selecting memory, 3D XPoint, other chalcogenide-based memories, FERAM, MRAM, NOR (e.g., NOR flash) memory, STT-MRAM, CBRAM, RRAM, or OxRAM.

Memory system 210 may include a storage controller 230 for controlling the passing of data directly to and from the memory devices 240, e.g., for storing data, retrieving data, and determining memory locations in which to store data and from which to retrieve data. Storage controller 230 may communicate with memory devices 240 directly or via a bus (not shown) using a protocol specific to each type of memory device. In some cases, a single storage controller 230 may be used to control multiple memory devices of the same or different types. In some cases, memory system 210 may include multiple storage controllers 230, e.g., a different storage controller 230 for each type of memory device 240. In some cases, storage controller 230 may implement aspects of a local controller 135 as described with reference to FIG. 1.

Memory system 210 may additionally include an interface 220 for communication with the host system 205 and a buffer 225 for temporary storage of data being transferred between the host system and the memory devices 240. Interface 220, buffer 225, and storage controller 230, may be for translating data between the host system 205 and the memory devices 240, e.g., as shown by data path 250, and may be collectively referred to as data path components.

Using buffer 225 to temporarily store data during transfers may allow data to be buffered as commands are being processed, thereby reducing latency between commands and allowing arbitrary data size associated with commands. This may also allow bursts of commands to be handled and the buffered data may be stored or transmitted (or both) once a burst has stopped. Buffer 225 may include relatively fast memory (e.g., some types of volatile memory, such as SRAM or DRAM) or hardware accelerators or both to allow fast storage and retrieval of data to and from buffer 225. Buffer 225 may include data path switching components for bi-directional data transfer between buffer 225 and other components.

The temporary storage of data within buffer 225 may refer to the storage of data in buffer 225 during the execution of access commands. That is, upon completion of an access command, the associated data may no longer be maintained in buffer 225 (e.g., may be overwritten with data for additional access commands). In addition, buffer 225 may be a non-cache buffer. That is, data may not be read directly from buffer 225 by the host system 205. For example, read commands may be placed on a queue without an operation to match the address to addresses already in the buffer (e.g., without a cache address match or lookup operation).

Memory system 210 may additionally include a memory system controller 215 for executing the commands received from the host system 205 and controlling the data path components in the moving of the data. Memory system controller 215 may be an example of the memory system controller 115 as described with reference to FIG. 1. A bus 235 may be used to communicate between the system components. In some examples (not shown), the memory system controller 215 may include one or more components of the memory system 210. For example, the memory system controller 215 may include one or more of the bus 235, the interface 220, the buffer 225, and the storage controller 230.

In some cases, one or more queues (e.g., a command queue 260, a buffer queue 265, and a storage queue 270) may be used to control the processing of the access commands and the movement of the corresponding data. This may be beneficial, e.g., when more than one access command from the host system 205 is processed concurrently by memory system 210. Command queue 260, buffer queue 265, and storage queue 270 are depicted at interface 220, memory system controller 215 and storage controller 230, respectively, as examples of a possible implementation. Queues, if used, may be positioned anywhere within memory system 210.

Data transferred between the host system 205 and the memory devices 240 may take a different path in memory system 210 than non-data information (e.g., commands, status information). For example, the system components in memory system 210 may communicate with each other using bus 235, while the data may use data path 250 through the data path components instead of bus 235. Memory system controller 215 may control how and when data is transferred between the host system 205 and the memory devices 240 by communicating with the data path components over bus 235 (e.g., using a protocol specific to memory system 210).

When a host system 205 transmits access commands to memory system 210, the commands may be received by interface 220, e.g., according to a protocol (e.g., a universal flash storage (UFS) protocol or an eMMC protocol). Thus, interface 220 may be considered a front end of memory system 210. Upon receipt of each access command, interface 220 may communicate the command to memory system controller 215, e.g., via bus 235. In some cases, each command may be added to command queue 260 by interface 220 to communicate the command to memory system controller 215.

Memory system controller 215 may determine that an access command has been received based on the communication from interface 220. In some cases, memory system controller 215 may determine the access command has been received by retrieving the command from command queue 260. The command may be removed from command queue 260 after it has been retrieved therefrom, e.g., by memory system controller 215. In some cases, memory system controller 215 may cause interface 220, e.g., via bus 235, to remove the command from command queue 260.

Upon the determination that an access command has been received, memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, memory system controller 215 may use buffer 225 for, among other things, temporary storage of the data being received from or sent to the host system 205. Buffer 225 may be considered a middle end of memory system 210. In some cases, buffer address management (e.g., pointers to address locations in the buffer) may be performed by hardware (e.g., dedicated circuits) in the interface 220, buffer 225, or storage controller 230.

To process a write command received from the host system 205, memory system controller 215 may first determine if buffer 225 has sufficient available space to store the data associated with the command. For example, memory system controller 215 may determine, e.g., via firmware (e.g., controller firmware), an amount of space within buffer 225 that may be available to store data associated with the write command.

In some cases, buffer queue 265 may be used to control flow of commands associated with data stored in buffer 225 including write commands. Buffer queue 265 may include the access commands associated with data currently stored in buffer 225. In some cases, the commands in command queue 260 may be moved to buffer queue 265 by memory system controller 215 and may remain in buffer queue 265 while the associated data is stored in buffer 225. In some cases, each command in buffer queue 265 may be associated with an address at buffer 225. That is, pointers may be maintained that indicate where in buffer 225 the data associated with each command is stored. Using buffer queue 265, multiple access commands may be received sequentially from the host system 205 and at least portions of the access commands may be processed concurrently.

If buffer 225 has sufficient space to store the write data, memory system controller 215 may cause interface 220 to transmit an indication of availability to the host system 205 (e.g., a "ready to transfer" indication), e.g., according to a protocol (e.g., a UFS protocol or an eMMC protocol). As interface 220 subsequently receives from the host system 205 the data associated with the write command, interface 220 may transfer the data to buffer 225 for temporary storage using data path 250. In some cases, interface 220 may obtain from buffer 225 or buffer queue 265 the location within buffer 225 to store the data. Interface 220 may indicate to memory system controller 215, e.g., via bus 235, when the data transfer to buffer 225 has been completed.

Once the write data has been stored in buffer 225 by interface 220, the data may be transferred out of buffer 225 and stored in a memory device 240. This may be done using storage controller 230. For example, memory system controller 215 may cause storage controller 230 to retrieve the data out of buffer 225 using data path 250, and transfer the data to a memory device 240. Storage controller 230 may be considered a back end of memory system 210. Storage controller 230 may indicate to memory system controller 215, e.g., via bus 235, when the data transfer to a memory device of the memory devices 240 has been completed.

In some cases, storage queue 270 may be used to aid with the transfer of write data. For example, memory system controller 215 may push (e.g., via bus 235) write commands from buffer queue 265 to storage queue 270 for processing. Storage queue 270 may include entries for each access command, and may include, e.g., a buffer pointer (e.g., an address) that may indicate where in buffer 225 the data associated with the command is stored and a storage pointer (e.g., an address) that may indicate the location in the memory devices 240 associated with the data. In some cases, storage controller 230 may obtain from buffer 225, buffer queue 265, or storage queue 270 the location within buffer 225 from which to obtain the data. Storage controller 230 may manage the locations within the memory devices 240 to store the data (e.g., performing wear-leveling, garbage collection, and the like). The entries may be added to storage queue 270, e.g., by memory system controller 215. The entries may be removed from the storage queue 270, e.g., by storage controller 230 or memory system controller 215 upon completion of the transfer of the data.

To process a read command received from the host system 205, memory system controller 215 may again first determine if buffer 225 has sufficient available space to store the data associated with the command. For example, memory system controller 215 may determine, e.g., via firmware (e.g., controller firmware), an amount of space within buffer 225 that may be available to store data associated with the read command.

In some cases, buffer queue 265 may be used to aid with buffer storage of data associated with read commands in a similar manner as discussed above with respect to write commands. For example, if buffer 225 has sufficient space to store the read data, memory system controller 215 may cause storage controller 230 to retrieve the data associated with the read command from a memory device 240 and store the data in buffer 225 for temporary storage using data path 250. Storage controller 230 may indicate to memory system controller 215, e.g., via bus 235, when the data transfer to buffer 225 has been completed.

In some cases, storage queue 270 may be used to aid with the transfer of read data. For example, memory system controller 215 may push the read command to storage queue 270 for processing. In some cases, storage controller 230 may obtain from buffer 225 or storage queue 270 the location within the memory devices 240 from which to retrieve the data. In some cases, storage controller 230 may obtain from buffer queue 265 the location within buffer 225 to store the data. In some cases, storage controller 230 may obtain from storage queue 270 the location within buffer 225 to store the data. In some cases, memory system controller 215 may move the command processed by storage queue 270 back to command queue 260.

Once the data has been stored in buffer 225 by storage controller 230, the data may be transferred out of buffer 225 and sent to the host system 205. For example, memory system controller 215 may cause interface 220 to retrieve the data out of buffer 225 using data path 250 and transmit the data to the host system 205, e.g., according to a protocol (e.g., a universal flash storage (UFS) protocol or an eMMC protocol). For example, the interface 220 may process the command from command queue 260 and may indicate to memory system controller 215, e.g., via bus 235, when the data transmission to the host system 205 has been completed.

Memory system controller 215 may execute received commands according to an order (e.g., a first-in, first-out order, according to the order of the command queue 260). For each command, memory system controller 215 may cause data corresponding to the command to be moved into and out of buffer 225, as discussed above. As the data is moved into and stored within buffer 225, the command may remain in buffer queue 265. A command may be removed from buffer queue 265, e.g., by memory system controller 215, when the processing of the command has been completed (e.g., when data corresponding to the access command has been transferred out of buffer 225). When a command is removed from buffer queue 265, the address previously storing the data associated with that command may be available to store data associated with a new command.

Memory system controller 215 may additionally be configured for operations associated with the memory devices 240. For example, memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may be noncontiguous physical block addresses. In some cases, storage controller 230 may be configured to perform one or more of the above operations in conjunction with or instead of memory system controller 215. In some cases, memory system controller 215 may perform the functions of storage controller 230 and storage controller 230 may be omitted.

In some examples, the memory system 210 may include or may be coupled with a PMIC that is configured to power one or more memory devices 240. The memory system 210 may include a capacitor (e.g., a tank capacitor) associated with each voltage supply that is configured to store a charge that may be used for providing a supply voltage to the memory devices 240. The capacitor may be charged using a respective DC-DC converter (e.g., charge pump, boost converter, step up converter, buck/boost converter, flyback converter, or any type of DC-DC converter). Each memory device 240 may include a first pass gate that is coupled with an internal node of the memory device 240 and a node coupled with the capacitor. Additionally or alternatively, each memory device 240 may include a second pass gate that is coupled with the internal node and a voltage source (e.g., a ground voltage source or node, a standby voltage source, etc.).

Each memory device 240 may be configured to operate in a first mode (e.g., an active mode) and a second mode (e.g., a low power mode, a standby mode). For example, when a memory device 240 operates in a first mode, the charge stored at the capacitor may be used to provide a supply voltage (e.g., current at the supply voltage) to the memory device 240. While operating in the first mode, the first pass gate may be activated to couple the internal node of the memory device 240 with the node coupled with the capacitor and the second pass gate may be deactivated. As the capacitor is discharged, it may be charged (e.g., re-charged) using the DC-DC converter. A voltage of the internal node of the memory device 240 may be approximately equal to the supply voltage provided by the PMIC.

In some instances, the memory device 240 may transition to operating in a second mode (e.g., a low power mode, a standby mode). While operating in the second mode, the first pass gate may be deactivated to isolate the internal node of the memory device 240 from the node coupled with the capacitor. Moreover, the second pass gate may be activated to couple the internal node of the memory device 240 with the voltage source (e.g., the ground voltage source). The internal node of the memory device 240 may be discharged (e.g., pulled to a ground voltage) based on activating the second pass gate. By discharging the internal node while the memory device 240 (e.g., the internal node of the memory device 240) is isolated from the PMIC, the capacitor may remain charged. The stored charge may be used to provide a supply voltage to the memory device 240 when it reenters the first mode (e.g., the active mode). Additionally, the stored charge may be used to provide a supply voltage to other memory devices 240 while the memory device 240 operating in the second mode has its internal node isolated from the capacitor. Accordingly, the capacitor may not have to be fully recharged, which may result in a substantial power savings for the memory system 210.

Figure 3:
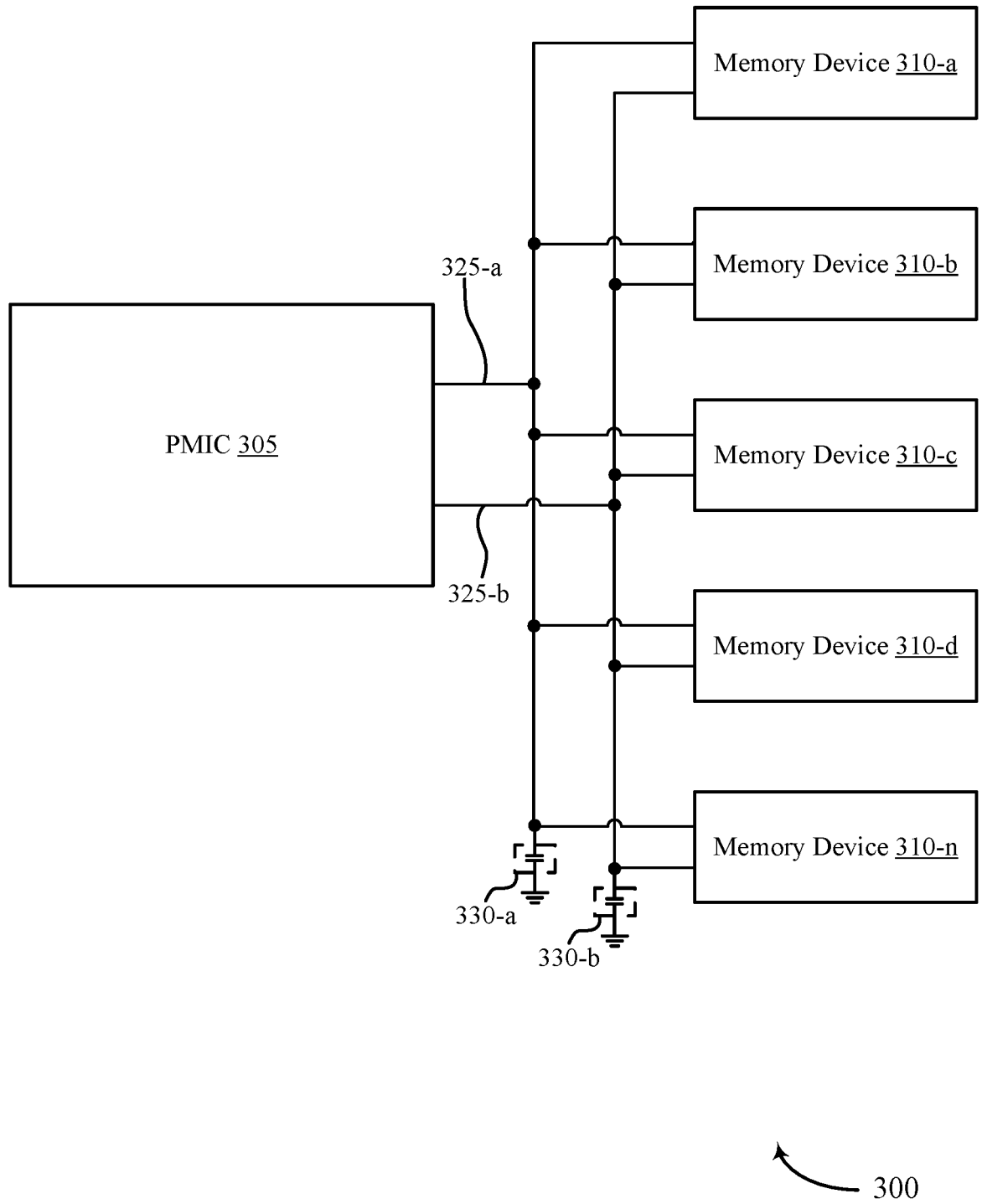
FIG. 3 illustrates an example of a memory system that supports operational modes for reduced power consumption in a memory system in accordance with examples as disclosed herein.

FIG. 3 illustrates an example of a memory system 300 that supports operational modes for reduced power consumption in a memory system in accordance with examples as disclosed herein. The memory system 300 may include a power management integrated circuit (PMIC) 305 and one or more memory devices 310. For example, the memory system 300 may include memory devices 310-a through 310-n, where 310-n represents an Nth memory device 310. The PMIC 305 may be configured to provide one or more supply voltages to the memory device 310 (e.g., where each memory device 310 may be a memory die, or may have more than one memory dice) using a respective DC-DC converter and capacitor 330 associated with each supply voltage (e.g., supply voltage node 325). In some examples, one or more of the memory devices 310 may operate in a low power mode that preserves a charge stored to the respective capacitor. When the memory device 310 is operated in an active mode, the stored charge may be provided as a supply voltage, which may reduce the power consumption of the memory system 300 that would otherwise be incurred by charging the capacitor.

In some examples, the PMIC 305 may be configured to provide one or more supply voltages to the memory devices 310. For example, the PMIC 305 may provide a supply voltage (VH(i)) to the memory devices 310, where i=1, 2, 3, etc. In some examples, the supply voltages may be a drain power voltage or a programming power voltage for the memory devices 310, and may be positive or negative voltages. The PMIC 305 may provide a supply voltage to memory devices 310 that is within a defined voltage range (e.g., as defined by a standard).

The PMIC 305 may provide various supply voltages to memory devices 310 using a respective DC-DC converter. For example, the PMIC may include N DC-DC converters that correspond to the N supply voltages (e.g., via supply voltage nodes 325) of the memory system 300. The supply voltage may be provided by the respective charge pumps, which may charge respective capacitors (e.g., tank capacitors) coupled with the charge pumps. In some examples, each DC-DC converter may be or may include a boost converter, charge pump, step up converter, buck/boost converter, flyback converter, or any type or combination of types of DC-DC converters.

The rate of charging the capacitors by the DC-DC converters may be different than the instantaneous current demands of the memory devices 310. The capacitors may provide decoupling or bypass capacitance for the memory devices 310. For example, the DC-DC converters may be able to output current at a first rate, while the memory devices 310 may draw power according to a second, higher rate for short durations of time (e.g., power spikes). Thus, the capacitors 330 may provide the current at the supply voltage for the power spikes of the memory devices 310, while keeping the supply voltage at the supply voltage nodes 325 relatively constant. Accordingly, a memory device 310 may receive a supply voltage from a capacitor 330 (e.g., the capacitor may be discharged to provide the memory device 310 with a supply voltage). As illustrated in FIG. 3, memory devices may have two supply voltage inputs coupled to supply voltage nodes 325-a and 325-b, which may be different voltages. PMIC 305 may have DC-DC converters for providing the supply voltage to supply voltage nodes 325-a and 325-b. Supply voltage node 325-a may be coupled with a capacitor 330-a while supply voltage node 325-b is coupled with capacitor 330-b.

In some examples, the components of each memory device 310 may be configured to operate using the provided supply voltages, which may be defined by or otherwise in accordance with a standard (e.g., a JEDEC standard). For example, the standard may define a voltage range for a supply voltage. Here, a memory device 310 operating using a supply voltage that is within the defined voltage range may be expected to satisfy one or more performance thresholds (e.g., a speed threshold for performing an access operation, a reliability threshold). In some examples, one or more of the memory devices 310 may operate in a low power mode that preserves a charge stored to the respective capacitor. When the memory device 310 is operated in an active mode, the stored charge may be provided as a supply voltage, which may reduce the power consumption of the PMIC 305 that would otherwise be incurred by charging the capacitor 330.

In some examples, the memory devices 310 may each include one or more memory dice. The memory dice may include one or more arrays, and each array may include one or more memory cells. For example, each memory array may include one or more non-volatile memory cells such as not-and (NAND) flash memory cells, memory cells that include chalcogenide (e.g., a chalcogenide storage element), and the like. Each memory device 310 may be configured to receive a supply voltage from the PMIC 305 which may, in turn, provide power to the respective non-volatile memory cells.

In some examples, each memory device 310 may operate in a first mode (e.g., an active mode) or a second mode (e.g., a low power mode, a standby mode). When operating in the first mode, a supply voltage may be applied to the respective memory device 310 from the PMIC 305. For example, the memory device 310-a may operate in a first mode and may receive a supply voltage of approximately 3.3V from the PMIC 305 via first supply node 325-a and a supply voltage of approximately 5V (or −5V) from the PMIC 305 via second supply node 325-b. The supply voltages may be provided to the memory device 310-a by first charging the capacitors 330-a and 330-b associated with the supply nodes 325-a and 325-b, respectively. As described herein, the capacitor may be charged using a DC-DC converter. The PMIC may receive an input power supply voltage from a power source (e.g., 1.8V) and operate (e.g., switch) the DC-DC converters to output the supply voltages to the supply voltage nodes 325-a and 325-b. The supply voltages may, in turn, be provided to the memory device 310-a from the capacitors 330. While operating in a first mode, the supply voltages may be continually provided to the memory device 310-a (from the capacitors), and the capacitors may be continually charged by the DC-DC converters. In some examples, some of the memory devices 310 may operate in the first mode while others are operating on the second mode.

When operating in the second mode, the supply voltage may be removed from an internal node of the respective memory device 310 (e.g., the internal node of the memory device 310 may be isolated from the capacitor 330). For example, the memory device 310-b may operate in a second mode and may isolated the internal supply nodes from the supply nodes 325-a and 325-b. The internal supply nodes of the memory device 310-b may be isolated from the voltage supply nodes 325 by deactivating pass gates coupled with the supply nodes and the internal supply nodes of the memory device 310-b. In some examples, despite being isolated from the PMIC 305, the internal supply node of the memory device 310-b may remain at the supply voltage (e.g., from when the memory device 310-b was operating in the first mode). Accordingly, when operating in the second mode, the internal node may be discharged (e.g., discharged to a different voltage such as a ground voltage). As described herein, the node may be discharged by activating a second pass gate, which may couple the node with a ground voltage source. By isolating the memory device 310-b from the supply node 325 before discharging the node, the capacitor 330 may remain charged (e.g., the capacitor 330 may not discharge).

By maintaining a respective capacitor 330 in a charged state when the node of a corresponding memory device 310 is discharged, the DC-DC converter may not have to fully recharge the capacitor 330. That is, when the memory device 310 resumes operating in a first mode, the charge stored to the capacitor may be provided as a supply voltage. As described herein, the capacitor may experience some leakage which may be accounted for by the DC-DC converter. That is, the DC-DC converter may be required to provide only a small amount of charge to the capacitor for it to be fully charged, which may reduce the overall power consumption of the memory system 300.

In some instances, aspects of the PMIC 305 may operate based on an operating mode of an associated memory device 310 (or associated memory devices 310). For example, the PMIC 305 may be configured to disable one or more DC-DC converters when a respective memory device 310 (or when respective memory devices 310) are operating in a second mode. In particular, when the memory device 310-a is operating in a second mode and an internal node of the memory device 310-a is discharged, a DC-DC converter of the PMIC 305 that corresponds to the memory device 310-a may be deactivated. Deactivating a DC-DC converter of the PMIC 305 when a corresponding memory device 310 is operating in a second mode may reduce the overall power consumption of the memory system 300.

Additionally or alternatively, the PMIC 305 may be configured to isolate a DC-DC converter from one or capacitors when one or more memory devices 310 associated with the DC-DC converter are operating in a second mode. In particular, the PMIC 305 may include one or more pass gates that are coupled with a DC-DC converter and a node that is coupled with a capacitor and one or more respective memory devices 310. When the respective memory devices are operating in a second mode (e.g., when the respective internal nodes are discharged), the pass gate(s) may be deactivated to isolate the DC-DC converter from the node (e.g., from the capacitor). Isolating the DC-DC converter from the capacitor may minimize the amount of leakage from the capacitor when the memory device 310 (or memory devices 310) is operating in the second mode.

In some examples, the pass gates for isolating the PMIC from the capacitor may be located outside of the PMIC 305 (e.g., the pass gates may be external). In other examples, the pass gates for isolating the PMIC 305 from the capacitor may be located within the PMIC 305 (e.g., the pass gates may be internal). In some cases, there may be one capacitor 330 for multiple memory devices 310. Alternatively, each memory device 310 may be associated with a separate capacitor. In such examples, the capacitors may be coupled with a respective pin (e.g., a second pin) of each memory device 310. That is, a first pin of each memory device 310 may be coupled with the PMIC 305 and a second pin (e.g., a pin different than the first pin) may be coupled with a respective capacitor. The memory device 310 may include a pass gate between the first pin and the second pin. Thus, in the second mode, the memory device 310 may isolate the capacitor from the external supply node 325, and may also isolate the capacitor from the internal supply node.

Figure 4:
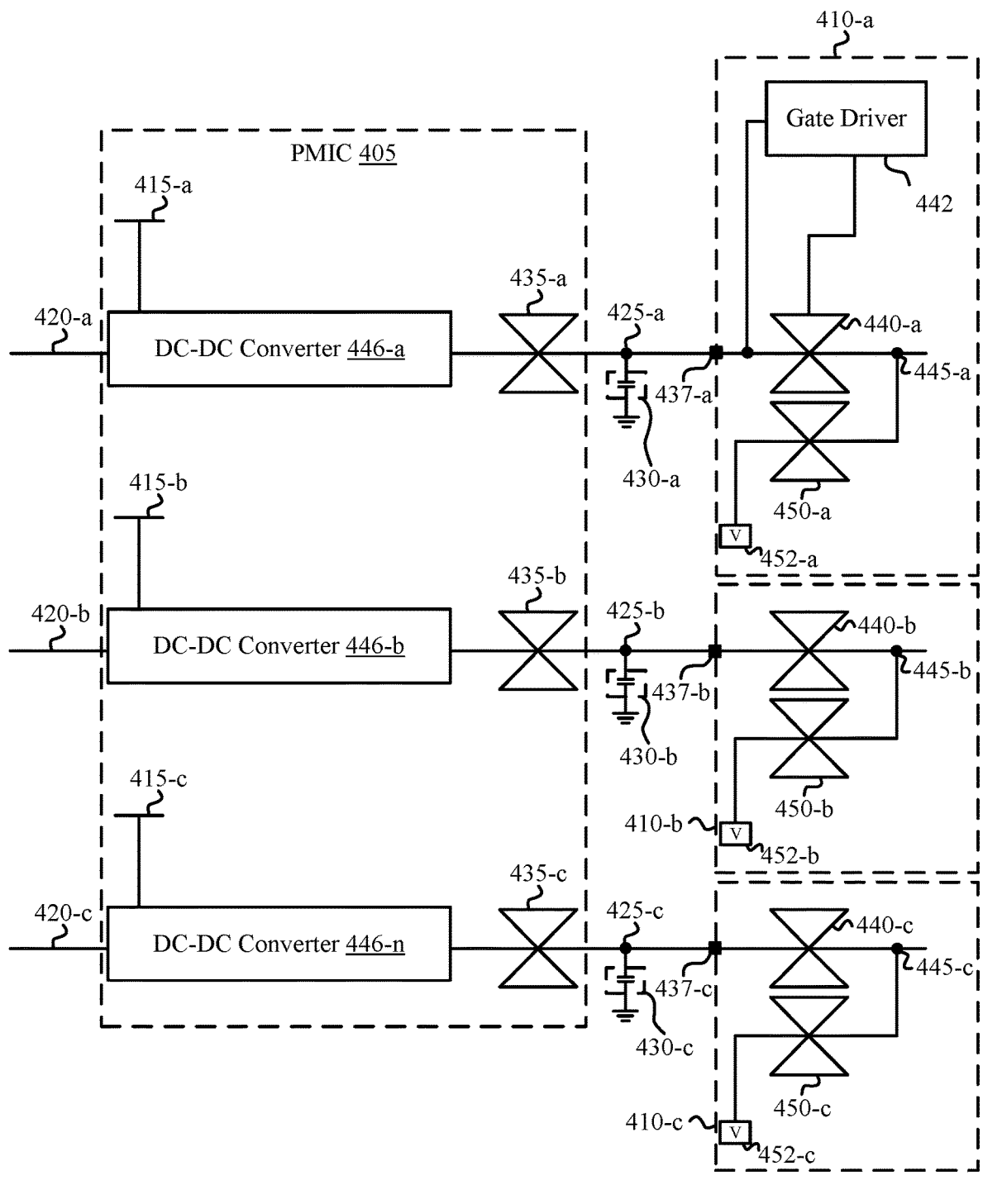
FIG. 4 illustrates an example of a memory system that supports operational modes for reduced power consumption in a memory system in accordance with examples as disclosed herein.

FIG. 4 illustrates an example of a memory system 400 that supports operational modes for reduced power consumption in a memory system in accordance with examples as disclosed herein. The memory system 400 may include one or more memory devices that are coupled with a DC-DC converter 446 of a PMIC 405 (e.g., a PMIC 305 as described with reference to FIG. 3). In some examples, the DC-DC converters 446 may be or may include one or more charge pumps, boost converters, step up converters, buck/boost converters, flyback converters, or any type or combination of types of DC-DC converters. The memory system 400 may include memory devices 410-a through 410-c that are coupled with DC-DC converters 446-a through 446-c, respectively. In other examples, the memory system 400 may include any quantity of memory devices 410 that are coupled with a DC-DC converter 446. For example, the DC-DC converter 446-a may be coupled with a single memory device 410 or may be coupled with multiple memory devices 410. Each memory device 410 may be independently coupled with or isolated from a node 425 (e.g., by internal or external pass gates) that is coupled with the DC-DC converter 446, in some cases.

Additionally or alternatively, each memory device 410 may be coupled with the PMIC 405, such that the PMIC 405 may provide one or more supply voltages to each memory device 410. For example, the PMIC 405 may provide a supply voltage (VH(i)) to the memory devices 410, where i=1, 2, 3, etc. In some examples, the supply voltages may be a bias power voltage, a programming power voltage, or a bulk node voltage for the memory devices 410, and may be positive or negative voltages. The supply voltage provided to each memory device 410 may be a same voltage (e.g., a same voltage provided to each memory device 410) or a different voltage (e.g., a different voltage may be provided to one or more memory devices 410). The PMIC 410 may provide a supply voltage to memory devices 410 that is within a defined voltage range (e.g., as defined by a standard).

In some examples, one or more of the memory devices 410 may operate in a low power mode that preserves a charge stored to a respective capacitor 430. When the memory device 410 returns to the active mode from the low power mode, the stored charge may be provided as a supply voltage, which may reduce the power consumption of the memory system 400 that would otherwise be incurred by discharging and charging the capacitor 430.

Each memory device 410 may be coupled with a portion of a PMIC 405 that is configured to provide a supply voltage to the memory device 410. For example, the memory device 410-a may be coupled with a node 425-a via a pad 437-a. Similarly, the memory device 410-b may be coupled with a node 425-b via a pad 437-b, and the memory device 410-c may be coupled with a node 425-c via a pad 437-c.

Each of the memory devices 410 may include a pass gate 440 (e.g., a first pass gate) that is coupled with a node of the PMIC 405 (e.g., a node 425) and a node of the memory device 410 (e.g., a node 445). The pass gate 440 may be or may include an NMOS or PMOS transistor. In some examples, the pass gate 440-a may be controlled by a gate driver 442. The gate driver 442 may be configured activate or deactivate the pass gate 440-a by applying or removing signaling. In some examples, the pass gate 440-a may be deactivated based on the gate driver 442 applying a voltage (e.g., a voltage within a threshold of the supply voltage). Accordingly, the gate driver 442 may be configured to deactivate the pass gate 440-*a* using the voltage applied to the node 425-*a*. In some examples, the gate driver 442 may control additional gates 440 of the memory system 400, and may be an example of a level-shifter configured to disable one or more pass gates 440 by supplying a voltage to disable the respective pass gate 440.

When the pass gate 440 is activated, a supply voltage may be provided to the internal node 445 of the memory device 410 by the PMIC. Additionally or alternatively, each of the memory devices 410 may include a pass gate 450 (e.g., a second pass gate) that is coupled with the node of the memory device 410 (e.g., the node 445) and a voltage supply (e.g., a ground voltage). In some examples, the pass gate 450 may be or may include an NMOS or PMOS transistor. When the pass gate 450 is activated, the node 445 may be discharged (e.g., pulled to ground). As described herein, when the pass gate 450 is activated and the node 445 is discharged, the capacitor 430 may remain charged. The charge stored to the capacitor may be used to provide a supply voltage to the memory device 410 when the memory device operates in an active mode.

As described herein, the PMIC may include one or more DC-DC converters 405 that are configured to provide a supply voltage to one or more memory devices 410. A DC-DC converter 446 may receive a voltage 415 (e.g., VCC) and a clock input 420. In some examples, the DC-DC converter 446 may operate according to the clock input 420 (e.g., according to a clock cycle provided by the clock input 420). The DC-DC converter 446 may be coupled with a capacitor 430 via a node 425, and may be configured to charge the capacitor 430. In some examples, the DC-DC converter 446 may be coupled with the capacitor 430 via a pass gate 435 and may be configured to charge the capacitor 430 when the pass gate 435 is activated.

In some examples, one or more of the memory devices 410 may operate in a first mode (e.g., an active mode). For example, the memory device 410-*a* may operate in the first mode while the memory devices 410-*b* and 410-*c* operate in a second mode (e.g., a standby mode). When operating in the first mode, the memory device 410-*a* may receive a supply voltage from the PMIC (e.g., from the capacitor 430-*a*). To receive the supply voltage, the first pass gate 440-*a* may be enabled and the second pass gate 450-*a* may be disabled, which may result in the supply voltage being applied to the node 445-*a*. The supply voltage applied to the node 445-*a* may be used to power various aspects of the memory device 410-*a*.

Prior to operating in the first mode (or subsequent to operating in the first mode), the DC-DC converter 446-*a* may charge the capacitor 430-*a*. To charge the capacitor 430-*a*, the DC-DC converter 446-*a* may receive a voltage 415-*a* and may operate a switching element (e.g., one or more switched capacitor stages) to provide the supply voltage to the capacitor according to the clock input 420-*a*. The DC-DC converter 446-*a* may operate the switching element at a frequency based on the clock input 420-*a*. For example, the frequency of the switching element may regulate the rate at which the DC-DC converter 446-*a* charges the capacitor 430-*a*. Thus the DC-DC converter 446-*a* may provide a greater or lesser quantity of charge to the capacitor 430-*a* over a duration based on the frequency of the switching element. In some cases, the DC-DC converter 446-*a* may be isolated from the capacitor 430-*a* when the pass gate 435-*a* is deactivated.

In some examples, the memory device 410-*a* may transition to operate in a second mode (e.g., a low power mode, a standby mode). When operating in the second mode, the memory device 410-*a* may be isolated from the PMIC and thus may not receive a supply voltage. To operate in the second mode, the first pass gate 440-*a* may be disabled, which may result in the node 445-*a* being isolated from the node 425-*a*. After the pass gate 440-*a* is disabled and the memory device 410-*a* is isolated from the PMIC, the node 445-*a* may still be at a voltage that is at or near the supply voltage. Accordingly, to operate the memory device 410-*a* in the second mode, the second pass gate 450-*a* may be enabled to couple the node 445-*a* with the voltage source 452-*a*. When coupled, the node 445-*a* may be pulled to a voltage associated with the voltage source 452-*a*. For example, the node 445-*a* may be pulled to ground (e.g., 0V) thus discharging the node 445-*a*.

The DC-DC converter 446-*a* may continue to supply charge to the capacitor 430-*a* when the memory device 410-*a* is operating in the second mode. For example the DC-DC converter 446-*a* may be operated at the same or a different frequency when the memory device 410-*a* is operating in the second mode. In some cases, the pass gate 435-*a* may be disabled when the memory device 410-*a* is operating in the second mode. In some cases, more than one memory device 410 may be coupled with node 425-*a*. In such cases, the pass gate 435-*a* may be disabled when all of the memory devices 410 coupled with node 425-*a* are operating in the second mode. For example, a host (e.g., host system 105) or memory system controller (e.g., memory system controller 115) may control whether the memory devices 410 are operating in the first mode or the second mode, and may indicate to the PMIC a quantity of devices operating in the first mode or second mode, or may indicate when all the memory devices 410 are operating in the second mode. In some examples, disabling the pass gate 435-*a* may isolate an output from the change pump 446-*a* when the memory device 410-*a* is in standby mode. Despite the DC-DC converter 446-*a* being isolated from the node 425-*a*, the capacitor 430-*a* may remain charged, or the supply voltage on capacitor 430-*a* may decay slowly. In some examples, isolating the capacitor 430-*a* from the DC-DC converter 405-*a* may minimize the amount of leakage from the capacitor 430-*a*.

When the memory device 410-*a* is operating in the second mode and isolated from the node 425-*a*, the capacitor 430-*a* may experience some leakage. Despite losing some minimal amount of charge, however, the capacitor 430-*a* may retain a large portion of its charge. Accordingly, the DC-DC converter 446-*a* may maintain the capacitor 430-*a* in a fully charged state while operating at a reduced frequency (e.g., while a switching component of the DC-DC converter 446-*a* is operating at a reduced frequency). Thus, when the memory device 410-*a* transitions to operate in the first mode (e.g., for a second time), the DC-DC converter 446-*a* may not have to charge the capacitor 430-*a* from an initial voltage such as a supply voltage or a ground voltage in order to provide a supply voltage to the memory device 410-*a*. Instead, the capacitor 430-*a* may have a residual charge and may begin providing the supply voltage to the memory device 410-*a*, or may be charged from an intermediate voltage using less power. In some examples, when the capacitor 430-*a* beings providing the supply voltage to the memory device 410-*a*, the frequency at which the DC-DC converter 446-*a* operates may increase to maintain the capacitor 430-*a* in a charged state.

In other examples (not shown), the PMIC may include additional DC-DC converters configured to operate when a respective memory device 410 is operating in a second mode. The additional DC-DC converters may be configured to provide a lesser amount of charge to the capacitors 430. For example, the additional DC-DC converters may be sized such that they are only able to provide an amount of current to the capacitors that is equal to the amount of current lost due to leakage. Thus reducing the frequency of a switching element of a DC-DC converter or operating an additional DC-DC converter to charge the capacitors 430 while a memory device 410 is operating in a second mode may produce similar results and benefits.

The memory system 400 may include a controller (e.g., a microcontroller) configured to activate the pass gates of the PMIC 405 and the pass gates of each memory device 410. For example, the memory system 400 may include a controller such as the memory system controller 115 as described with reference to FIG. 1 that is configured to activate the pass gates by applying a signal (e.g., an enable signal) and deactivate the pass gates by removing the signal. Additionally or alternatively, the PMIC 405 and memory devices 410 may each include a local controller such as the local controller 135-*a* as described with reference to FIG. 1 that is configured to activate respective pass gates by applying a signal (e.g., an enable signal) and deactivate the respective pass gates by removing the signal.

Additionally or alternatively, the pass gate 440 and the pass gate 450 of the memory devices 410 may be internal to a respective memory device, or may be external switches. For example, the pass gate 440 and the pass gate 450 may be external switches on a printed circuit board (PCB). In other examples, the pass gate 440 and the pass gate 450 may be internal to the PMIC, though such an example may require separate outputs for each memory device 410 that are independent of the outputs coupled with the capacitors 430. The pass gates 435 may be internal to the PMIC 405, or external (e.g., on the PCB), in some cases.

As described herein, each of the memory devices 410 may operate in a first mode or a second mode independent of the other memory devices 410. For example, the memory device 410-*a* and memory device 410-*b* may operate in a first mode while the memory device 410-*c* operates in a second mode. Moreover, although operations of the memory device 410-*a* were discussed in detail, the memory device 410-*b* and memory device 410-*c* may include the same or similar components and may operate in a same or similar manner. By operating the memory devices 410 as described herein, the overall power consumption of the memory system 400 may be reduced.

Figure 5:
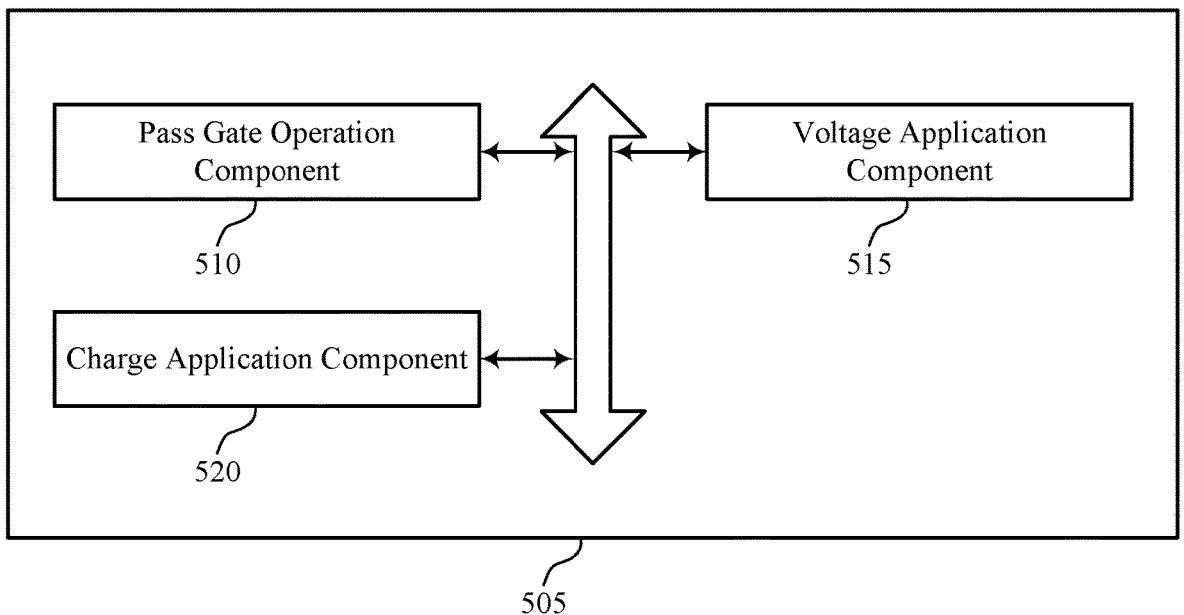
FIG. 5 shows a block diagram of a memory system that supports operational modes for reduced power consumption in a memory system in accordance with aspects of the present disclosure.

FIG. 5 shows a block diagram 500 of a memory system 505 that supports operational modes for reduced power consumption in a memory system in accordance with examples as disclosed herein. The memory system 505 may be an example of aspects of a memory system as described with reference to FIGS. 1 through 4. The memory system 505 may include a pass gate operation component 510, a voltage application component 515, and a charge application component 520. Each of these modules may communicate, directly or indirectly, with one another (e.g., via one or more buses).

The pass gate operation component 510 may operate a non-volatile memory of a memory system in a first mode, the memory system including a first node coupled with a DC-DC converter and a capacitor, and the non-volatile memory including a second node, where operating the non-volatile memory in the first mode includes activating a first pass gate coupled with the first node and the second node to connect the second node to a voltage generated by the DC-DC converter. In some examples, the pass gate operation component 510 may operate the non-volatile memory in a second mode by deactivating the first pass gate to isolate the first node from the second node and activating a second pass gate to discharge the second node.

In some examples, the pass gate operation component 510 may operate the non-volatile memory in the first mode for a second time, where operating the non-volatile memory in the first mode for the second time includes deactivating the second pass gate and activating the first pass gate to connect the second node to a voltage supplied by the capacitor that is based on the residual charge. In some examples, the pass gate operation component 510 may operate a second non-volatile memory of the memory system in the first mode while the non-volatile memory is operating in the second mode, the memory system including a third node coupled with a second DC-DC converter and a second capacitor, and the second non-volatile memory including a fourth node, where operating the second non-volatile memory in the first mode includes activating a third pass gate coupled with the third node and the fourth node to connect the fourth node to a voltage generated by the second DC-DC converter.

In some examples, the pass gate operation component 510 may operate the second non-volatile memory in the second mode while the non-volatile memory is operating in the second mode, where operating the second non-volatile memory in the second mode includes deactivating the third pass gate to isolate the third node from the fourth node and activating a fourth pass gate to discharge the fourth node. In some examples, the pass gate operation component 510 may operate a third non-volatile memory of the memory system in a first mode while the non-volatile memory is operating in the second mode, the third non-volatile memory including a fifth node, where operating the third non-volatile memory in the first mode includes activating a fifth pass gate coupled with the first node and the fifth node to connect the fifth node to a voltage generated by the DC-DC converter.

The memory system may include a voltage source coupled with the DC-DC converter and the voltage application component 515 may apply, from the voltage source, a voltage to the DC-DC converter.

The memory system may include a voltage source coupled with the DC-DC converter and the charge application component 520 may apply, by the DC-DC converter based on the voltage, a charge to the capacitor, where at least a portion of the charge is applied to the capacitor before operating the non-volatile memory in the first mode. In some examples, charge application component 520 may refrain from applying an additional charge to the capacitor while the non-volatile memory is operating in the second mode, where the capacitor includes a residual charge upon refraining from applying the additional charge while the non-volatile memory is operating in the second mode.

In some examples, the charge application component 520 may reduce a frequency of a switching element of the DC-DC converter based on operating the non-volatile memory in the second mode. In some examples, the charge application component 520 may apply, from the DC-DC converter, a second charge to the capacitor based on reducing the frequency of the switching element of the DC-DC converter.

In some examples, discharging the second node includes pulling the second node to a ground voltage. In some cases, the second mode of the non-volatile memory includes a standby mode.

Figure 6:
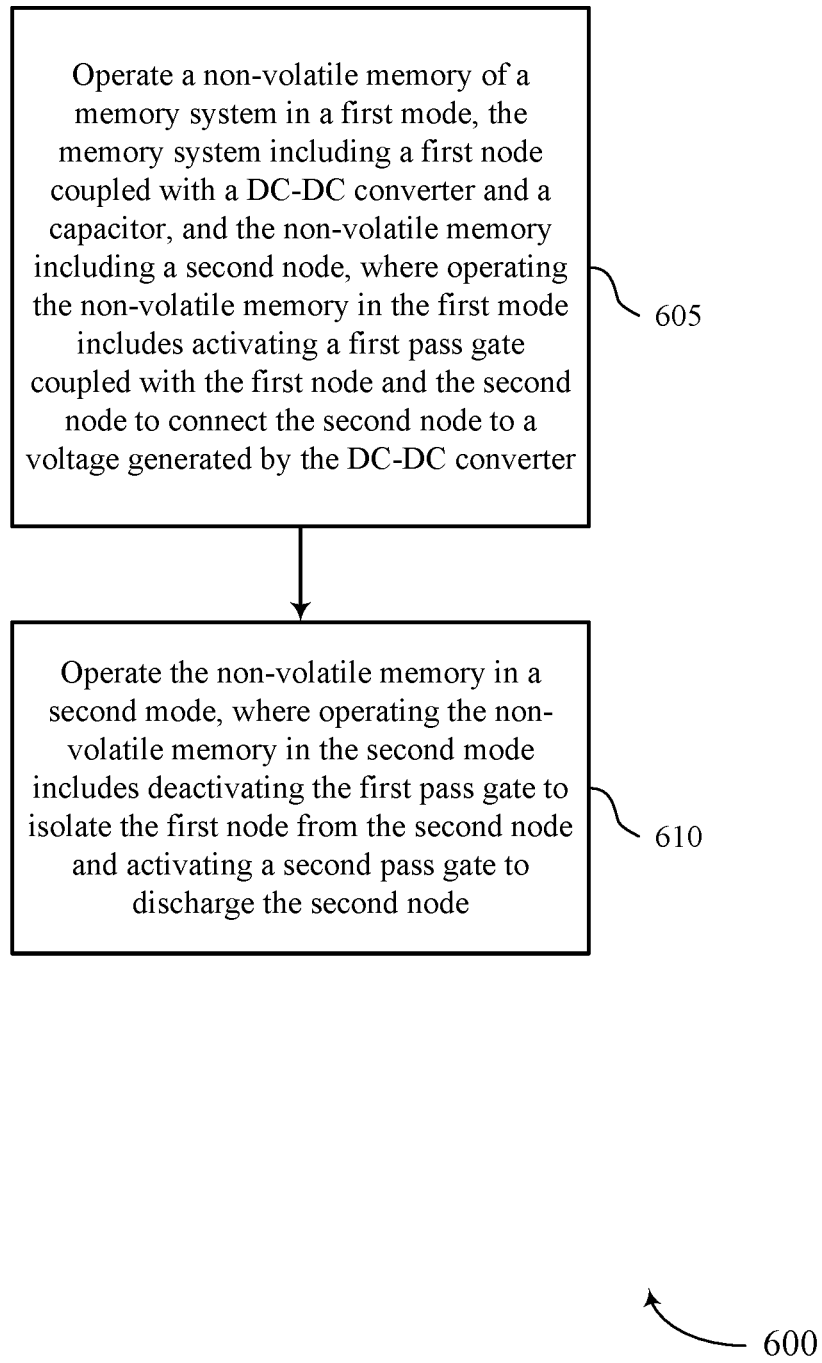
FIG. 6 shows a flowchart illustrating a method or methods that support operational modes for reduced power consumption in a memory system in accordance with examples as disclosed herein.

FIG. 6 shows a flowchart illustrating a method or methods 600 that supports operational modes for reduced power consumption in a memory system in accordance with aspects of the present disclosure. The operations of method 600 may be implemented by a memory system or its components as described herein. For example, the operations of method 600 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 605, a non-volatile memory of a memory system may be operated in a first mode, the memory system including a first node coupled with a DC-DC converter and a capacitor, and the non-volatile memory including a second node, where operating the non-volatile memory in the first mode includes activating a first pass gate coupled with the first node and the second node to connect the second node to a voltage generated by the DC-DC converter. The operations of 605 may be performed according to the methods described herein. In some examples, aspects of the operations of 605 may be performed by a pass gate operation component as described with reference to FIG. 5.

At 610, the non-volatile memory may be operated in a second mode, where operating the non-volatile memory in the second mode includes deactivating the first pass gate to isolate the first node from the second node and activating a second pass gate to discharge the second node. The operations of 610 may be performed according to the methods described herein. In some examples, aspects of the operations of 610 may be performed by a pass gate operation component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for operating a non-volatile memory of a memory system in a first mode, the memory system including a first node coupled with a DC-DC converter and a capacitor, and the non-volatile memory including a second node, where operating the non-volatile memory in the first mode includes activating a first pass gate coupled with the first node and the second node to connect the second node to a voltage generated by the DC-DC converter and operating the non-volatile memory in a second mode, where operating the non-volatile memory in the second mode includes deactivating the first pass gate to isolate the first node from the second node and activating a second pass gate to discharge the second node.

In some examples of the method 600 and the apparatus described herein, the memory system may include operations, features, means, or instructions for applying, from the voltage source, a voltage to the DC-DC converter, and applying, by the DC-DC converter based on the voltage, a charge to the capacitor, where at least a portion of the charge may be applied to the capacitor before operating the non-volatile memory in the first mode.

Some examples of the method 600 and the apparatus described herein may further include operations, features, means, or instructions for refraining from applying an additional charge to the capacitor while the non-volatile memory may be operating in the second mode, where the capacitor includes a residual charge upon refraining from applying the additional charge while the non-volatile memory may be operating in the second mode, and operating the non-volatile memory in the first mode for a second time, where operating the non-volatile memory in the first mode for the second time includes deactivating the second pass gate and activating the first pass gate to connect the second node to a voltage supplied by the capacitor that may be based on the residual charge.

Some examples of the method 600 and the apparatus described herein may further include operations, features, means, or instructions for reducing a frequency of a switching element of the DC-DC converter based on operating the non-volatile memory in the second mode, and applying, from the DC-DC converter, a second charge to the capacitor based on reducing the frequency of the switching element of the DC-DC converter.

Some examples of the method 600 and the apparatus described herein may further include operations, features, means, or instructions for operating a second non-volatile memory of the memory system in the first mode while the non-volatile memory may be operating in the second mode, the memory system including a third node coupled with a second DC-DC converter and a second capacitor, and the second non-volatile memory including a fourth node, where operating the second non-volatile memory in the first mode includes activating a third pass gate coupled with the third node and the fourth node to connect the fourth node to a voltage generated by the second DC-DC converter.

Some examples of the method 600 and the apparatus described herein may further include operations, features, means, or instructions for operating the second non-volatile memory in the second mode while the non-volatile memory may be operating in the second mode, where operating the second non-volatile memory in the second mode includes deactivating the third pass gate to isolate the third node from the fourth node and activating a fourth pass gate to discharge the fourth node.

Some examples of the method 600 and the apparatus described herein may further include operations, features, means, or instructions for operating a third non-volatile memory of the memory system in a first mode while the non-volatile memory may be operating in the second mode, the third non-volatile memory including a fifth node, where operating the third non-volatile memory in the first mode includes activating a fifth pass gate coupled with the first node and the fifth node to connect the fifth node to a voltage generated by the DC-DC converter.

In some examples of the method 600 and the apparatus described herein, discharging the second node may include operations, features, means, or instructions for pulling the second node to a ground voltage.

In some examples of the method 600 and the apparatus described herein, the second mode of the non-volatile memory includes a standby mode.

It should be noted that the methods described above describe possible implementations, and that the operations and the steps may be rearranged or otherwise modified and that other implementations are possible. Further, portions from two or more of the methods may be combined.

A system is described. The system may include a DC-DC converter coupled with a first node and configured to transfer charge to the first node to establish a voltage at the first node, a capacitor coupled with the first node and configured to receive the charge from the DC-DC converter, a non-volatile memory including a second node, a first pass gate coupled with the first node and the second node, where the first pass gate is configured to be activated during a first mode and is configured to be deactivated during a second mode, and a second pass gate coupled with the second node and configured to be deactivated during the first mode and configured to be activated during the second mode to discharge the second node.

In some examples, a voltage supply coupled with the DC-DC converter, where the voltage supply may be configured to apply a voltage to the DC-DC converter, where the DC-DC converter may be configured to transfer the charge to the first node based on receiving the voltage from the voltage supply.

In some examples, a second DC-DC converter coupled with the voltage supply and a third node, where the second DC-DC converter may be configured to transfer charge to the third node to establish a second voltage at the third node, a second capacitor coupled with the third node, where the second capacitor may be configured to receive the charge from the second DC-DC converter, a second non-volatile memory including a fourth node, where the second non-volatile memory may be configured to operate in the first mode or the second mode while the non-volatile memory operates in the first mode or the second mode, a third pass gate coupled with the third node and the fourth node, where the first pass gate may be configured to be activated during the first mode and deactivated during the second mode, and a fourth pass gate coupled with the fourth node, where the fourth pass gate may be configured to be deactivated during the first mode and activated during the second mode to discharge the fourth node.

In some examples, a voltage source coupled with the second pass gate, where the second node may be configured to be discharged to a voltage associated with the voltage source based on activating the second pass gate during the second mode.

In some examples, the DC-DC converter may be configured to operate at a reduced frequency based on the non-volatile memory operating in the first mode for a second time.

In some examples, a fifth pass gate coupled with the DC-DC converter and the first node, where the fifth pass gate may be configured to be activated during the first mode and deactivated during the second mode.

A system is described. The system may include a DC-DC converter and a capacitor coupled with a first node, a non-volatile memory including a second node coupled with a first pass gate and a second pass gate, where the first pass gate is coupled with the first node, and a controller coupled with the DC-DC converter and the non-volatile memory, where the controller is configured to operate the non-volatile memory in a first mode by activating the first pass gate and deactivating the second pass gate, where the second node is connected to a voltage generated by the DC-DC converter based on activating the first pass gate and deactivating the second pass gate and operate the non-volatile memory in a second mode by deactivating the first pass gate and activating the second pass gate, where the second node is discharged when the non-volatile memory is operating in the second mode.

Some examples may further include apply a first control signal to the first pass gate to activate the first pass gate when operating the non-volatile memory in the first mode, and remove the first control signal from the first pass gate to deactivate the first pass gate when operating the non-volatile memory in the second mode.

Some examples may further include apply a second control signal to the second pass gate to activate the second pass gate when operating the non-volatile memory in the second mode, and remove the second control signal from the second pass gate to deactivate the first pass gate when operating the non-volatile memory in the first mode.

In some examples, the system further may include operations, features, means, or instructions for a second DC-DC converter and a second capacitor coupled with a third node, and a second non-volatile memory including a fourth node coupled with a third pass gate and a fourth pass gate, where the controller may be configured to.

Some examples may further include operating the second non-volatile memory in the second mode while the non-volatile memory may be operating in the first mode or the second mode, where operating the second non-volatile memory in the second mode includes deactivating the third pass gate to isolate the third node from the fourth node and activating the fourth pass gate to discharge the fourth node.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
coupling, based at least in part on operating a memory system in a first mode, a Direct Current to Direct Current (DC-DC) converter and a memory device with a capacitor, wherein coupling the DC-DC converter with the capacitor charges the capacitor, and wherein coupling the memory device with the capacitor supplies a voltage to the memory device; and
isolating the DC-DC converter and the memory device from the capacitor based at least in part on operating the memory system in a second mode.

2. The method of claim 1, wherein the capacitor stores a residual charge while the memory system is operating in the second mode based at least in part on isolating the memory device from the capacitor.

3. The method of claim 1, further comprising:
coupling the memory device to a ground voltage after isolating the memory device from the capacitor based at least in part on operating the memory system in the second mode.

4. The method of claim 1, further comprising:
activating, based at least in part on operating in the first mode, a first pass gate coupled with the DC-DC converter and the capacitor, wherein coupling the DC-DC converter with the capacitor is based at least in part on activating the first pass gate.

5. The method of claim 4, further comprising:
deactivating, based at least in part on operating in the second mode, the first pass gate, wherein isolating the DC-DC converter from the capacitor is based at least in part on deactivating the first pass gate.

6. The method of claim 1, further comprising:
activating, based at least in part on operating in the first mode, a second pass gate coupled with the memory device and the capacitor, wherein coupling the memory device with the capacitor is based at least in part on activating the second pass gate.

7. The method of claim 6, further comprising:
deactivating, based at least in part on operating in the second mode, the second pass gate, wherein isolating the memory device from the capacitor is based at least in part on deactivating the second pass gate.

8. The method of claim 1, further comprising:
operating, based at least in part on operating in the first mode, a switching element of the DC-DC converter according to a first frequency to charge the capacitor according to a first rate; and
operating, based at least in part on operating the memory system in the second mode, the switching element of the DC-DC converter according to a second frequency to charge the capacitor according to a second rate.

9. The method of claim 8, wherein:
the first frequency is greater than the second frequency; and
the first rate is greater than the second rate.

10. The method of claim 1, wherein the second mode of the memory system comprises a standby mode.

11. A system comprising:
a memory device;
a capacitor in electronic communication with the memory device and configured to supply a voltage to the memory device during a first mode;
a Direct Current to Direct Current (DC-DC) converter in electronic communication with the capacitor and configured to charge the capacitor during the first mode; and
a first pass gate in electronic communication with the memory device and the capacitor, and configured to be deactivated during a second mode to isolate the capacitor and the DC-DC converter from the memory device during the second mode.

12. The system of claim 11, further comprising:
a second pass gate in electronic communication with the DC-DC converter and the capacitor and configured to be deactivated during the second mode to isolate the DC-DC converter from the capacitor during the second mode.

13. The system of claim 11, further comprising:
a voltage supply in electronic communication with the DC-DC converter and configured to apply a voltage to the DC-DC converter.

14. The system of claim 11, further comprising:
a third pass gate in electronic communication with the memory device and a ground voltage and configured to be activated during the second mode, wherein activating the third pass gate couples the memory device with the ground voltage during the second mode.

15. The system of claim 11, wherein the DC-DC converter comprises a switching element configured to:
operate according to a first frequency during the first mode to charge the capacitor according to a first rate; and
operate according to a second frequency during the second mode to charge the capacitor according to a second rate.

16. The system of claim 15, wherein:
the first frequency is greater than the second frequency; and
the first rate is greater than the first rate.

17. The system of claim 11, wherein the DC-DC converter comprises a boost converter or a charge pump.

18. A system, comprising:
a memory device;
a capacitor in electronic communication with memory device;
a Direct Current to Direct Current (DC-DC) converter in electronic communication with the capacitor; and
a controller in electronic communication with the memory device, the capacitor, and the DC-DC converter, wherein the controller is configured to:
couple, based at least in part on operating in a first mode, the DC-DC converter and the memory device with a capacitor, wherein coupling the DC-DC converter with the capacitor charges the capacitor, and wherein coupling the memory device with the capacitor supplies a voltage to the memory device; and
isolate the DC-DC converter and the memory device from the capacitor based at least in part on operating in a second mode.

19. The system of claim 18, wherein the capacitor is configured to store a residual charge while the memory device is operating in the second mode based at least in part on isolating the memory device from the capacitor.

20. The system of claim 18, wherein the controller is further configured to:
couple the memory device to a ground voltage after isolating the memory device from the capacitor based at least in part on operating the memory device in the second mode.

\* \* \* \* \*